(12) United States Patent
Kuwano

(10) Patent No.: US 7,911,284 B2
(45) Date of Patent: Mar. 22, 2011

(54) VOLTAGE CONTROLLED OSCILLATOR

(75) Inventor: Akira Kuwano, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 40 days.

(21) Appl. No.: 12/076,740

(22) Filed: Mar. 21, 2008

(65) Prior Publication Data

US 2008/0238559 A1  Oct. 2, 2008

(30) Foreign Application Priority Data

Mar. 28, 2007  (JP) .................... 2007-085080

(51) Int. Cl.
*H03L 5/00* (2006.01)

(52) U.S. Cl. ............. 331/109; 331/117 R; 331/117 FE; 331/167; 331/175; 331/177 V; 331/182; 331/185; 331/1 R

(58) Field of Classification Search .............. 331/109, 331/117 R, 117 FE, 167, 175, 177 V, 182, 331/185, 45, 183
See application file for complete search history.

(56) References Cited

U.S. PATENT DOCUMENTS

| | | | |
|---|---|---|---|
| 6,549,082 B2 * | 4/2003 | Ipek et al. ................. | 331/57 |
| 6,680,655 B2 * | 1/2004 | Rogers ..................... | 331/109 |
| 6,838,952 B2 * | 1/2005 | Ramet ..................... | 331/183 |
| 6,906,596 B2 * | 6/2005 | Kitamura et al. .......... | 331/36 C |
| 6,909,336 B1 * | 6/2005 | Rajagopalan et al. ...... | 331/183 |
| 7,324,561 B1 * | 1/2008 | Miller et al. .............. | 370/516 |
| 7,327,201 B2 * | 2/2008 | Miyashita et al. ......... | 331/185 |
| 7,415,369 B1 * | 8/2008 | Wang et al. ............... | 702/64 |
| 2004/0092241 A1 * | 5/2004 | Kim et al. ................. | 455/255 |
| 2005/0275469 A1 * | 12/2005 | Metaxakis ................ | 331/16 |
| 2006/0158271 A1 * | 7/2006 | Juang et al. .............. | 331/74 |
| 2008/0048795 A1 * | 2/2008 | Hoshino et al. ........... | 331/183 |

FOREIGN PATENT DOCUMENTS

| | | |
|---|---|---|
| JP | 2001-313527 | 11/2001 |
| JP | 2007-28613 | 2/2007 |

* cited by examiner

*Primary Examiner* — Arnold Kinkead
*Assistant Examiner* — Richard Tan
(74) *Attorney, Agent, or Firm* — McGinn Intellectual Property Law Group, PLLC

(57) ABSTRACT

A voltage controlled oscillator circuit comprises a variable current generator to supply an operation current to a voltage controlled oscillator, the voltage controlled oscillator to include a resonance circuit having a variable capacitor and inductor, and to output an output signal having an amplitude based on a current generated by the variable current generator, and a first optimization circuit to which the output signal is inputted, the first optimization circuit generating and outputting a current setting signal based on an amplitude change of the output signal corresponding to a change of a current outputted by the variable current generator to the variable current generator.

18 Claims, 6 Drawing Sheets

US 7,911,284 B2

VOLTAGE CONTROLLED OSCILLATOR

BACKGROUND OF THE INVENTION

1. Field of the Invention

The present invention relates to voltage controlled oscillators, and more particularly to voltage controlled oscillators used in local signal generators.

2. Description of Related Art

In radio device, communication is performed by modulating or demodulating data signal. Therefore the radio device has a local oscillator to modulate or demodulate data signal. A voltage controlled oscillator for determining oscillation frequency based on an input voltage is used as the local oscillator. With such a voltage controlled oscillator, there is the case that a phase noise is superimposed on the oscillation output signal. The phase noise is caused by an element characteristic of an element which constitutes the voltage controlled oscillator, noises of a power supply and so on. Since the phase noise is a noise for a receiving signal, it causes degradation of sensitivity or signal quality. The voltage controlled oscillator for eliminating the phase noise is disclosed in Japanese Unexamined Patent Application Publication No. 2001-313527 (Ito) and Japanese Unexamined Patent Application Publication No. 2007-28613 (Ri).

FIG. 7 shows a voltage controlled oscillator of Ito. According to the voltage controlled oscillator circuit of FIG. 7, capacitance values of variable capacitors CV11, CV12 are controlled by a frequency control voltage Vtu. Therefore, oscillation frequency $f_0$ which is generally represented by $f_0 = 1/\{2\pi(L \times C)^{0.5}\}$ is changed with changing a capacitance component of an LC resonance circuit.

According to the art of Ito, amount of a current which is supplied to an amplifier 143 is changed based on the voltage Vtu which controls the oscillation frequency. This change of the amount of the current changes the gain of the amplifier 143 and the phase noise is lowered. Ri discloses the voltage controlled oscillator which can control amplitudes of oscillation signal by changing gain of an active load.

However, there is a case in the above art that the amplifier amplifies the current excessively by variability of an element which constitutes the voltage controlled oscillator. In this case, although the amplitude is controlled based on a control voltage which sets an outputting frequency as disclosed by Ito, there is a case that the amplifier the current amplifies excessively and the phase noise characteristic deteriorates.

SUMMARY

According to one aspect of the present invention, there is provided a voltage controlled oscillator circuit comprising a variable current generator supplying an operation current based on a current setting signal, the voltage controlled oscillator including a resonance circuit having a variable capacitor and an inductor, and outputting an output signal having an amplitude based on a current generated by the variable current generator, and a first optimization circuit receiving the output signal, and generating and outputting the current setting signal to the variable current generator based on an amplitude change of the output signal corresponding to a change of a current outputted by the variable current generator.

According to the present invention, the current is set based on the change of the amplitude. Therefore in a case that the current value is changed but the amplitude is not changed, an excess current is not supplied to the variable current generator. That is, according to the present invention, the phase noise in the voltage controlled oscillator circuit can be reduced.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 1:
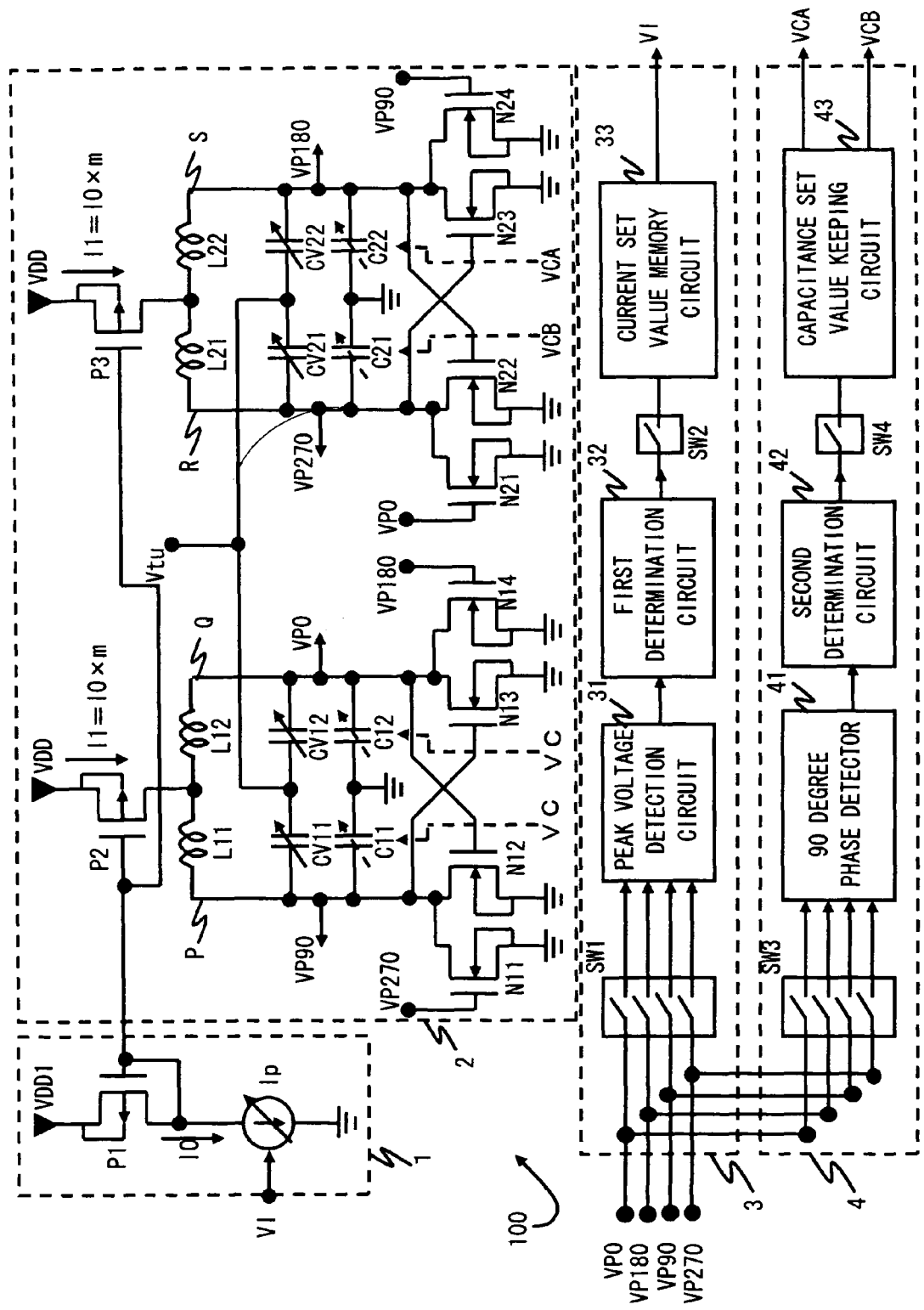
FIG. 1 is a circuit diagram showing a voltage controlled oscillator circuit according to a first embodiment of the present invention.

The specific embodiment to which the present invention is applied will now be described in detail with reference to the drawings. FIG. 1 is a circuit diagram showing a voltage controlled oscillator circuit according to a first embodiment of the present invention. As shown in FIG. 1, the voltage controlled oscillator circuit 100 of the embodiment includes a variable current generator 1, a voltage controlled oscillator 2, a first optimization circuit 3 and a second optimization circuit 4.

The variable current generator 1 generates an operation current when the voltage controlled oscillator 2 operates based on a current setting signal VI inputted. Note that, the operation current can be changed by the current setting signal VI. The voltage controlled oscillator 2 outputs a voltage signal which has a frequency based on a frequency control voltage Vtu. In addition, as will be understood by FIG. 1, the voltage controlled oscillator 2 of the embodiment outputs four-phase signals (VP0, VP90, VP180, VP270) whose phases are different by 90-degrees from one another. The first optimization circuit 3 outputs the current setting signal VI based on the output of the voltage controlled oscillation 2. The second optimization circuit 4 outputs a signal to suppress a quadrature error of the four-phase output signals based on the output of the voltage controlled oscillator 2. Hereinafter detailed constitutions of each block will be described.

The variable current generator 1 includes a power supply voltage VDD (first power supply voltage), a first PMOS transistor P1, and current source Ip. The source of the first PMOS transistor P1 is connected to the first power supply voltage VDD1, and the drain is connected to the gate of the first PMOS transistor P1 and one end of the current source Ip. The other end of the current source Ip is connected to a ground voltage which is a second power voltage. The current setting signal VI which is outputted from the first optimization circuit 3 is inputted to the current source Ip and the current source Ip generates a current which has a current value $I_0$ based on the current setting signal VI.

The voltage controlled oscillator 2 includes a second PMOS transistor P2, a third PMOS transistor P3, the first to forth inductors L11, L12, L21, L22, variable capacitors CV11, CV12, CV21, CV22, C11, C12, C21, C22, and first to eighth NMOS transistors N11-N14, N21-N24.

The first PMOS transistor P1 and the second PMOS transistor P2 configure a current mirror. The current mirror supplies the operation current to the voltage controlled oscillator 2. Note that, the current that is actually supplied to the voltage controlled oscillator 2 has current value of I1=I0×m based on a mirror ratio of the PMOS transistors P1 and P2. The source of the second PMOS transistor P2 is connected to the power supply voltage VDD, and the drain is connected to anode between the first inductor L11 and the second inductor L12. The gate of the second PMOS transistor P2 is connected to the gate of the first PMOS transistor P1.

The first PMOS transistor P1 and the third PMOS transistor P3 configure a current mirror. The current mirror supplies the operation current to the voltage controlled oscillator 2. Note that, the current that is actually supplied to the voltage controlled oscillator 2 has current value of I1=I0×m based on a mirror ratio of the PMOS transistors P1 and P3. The source of the third PMOS transistor P3 is connected to the power supply voltage VDD, and the drain is connected to anode between the third inductor L21 and the fourth inductor L22. The gate of the third PMOS transistor P3 is connected to the gate of the first PMOS transistor P1.

A node which is not connected to the second PMOS transistor P2 of the first inductor L11 is called P, a node which is not connected to the second PMOS transistor P2 of the second inductor L12 is called Q, a node which is not connected to the third PMOS transistor P3 of the third inductor L21 is called R, a node which is not connected to the third PMOS transistor P3 of the fourth inductor L22 is called S. Hereinafter, a connecting relation of the voltage controlled oscillator 2 will be described in detail (see FIG. 1).

The variable capacitor CV11 and the variable capacitor CV12 are connected between the node P and the node Q in series. The variable capacitor CV11 is connected to the node P and the variable capacitor CV12 is connected to the node Q. The frequency control voltage Vtu is applied to a node between the variable capacitors CV11 and CV12.

The variable capacitor C11 and the variable capacitor C12 are also connected between the node P and the node Q in series. The variable capacitor C11 is connected to the node P and the variable capacitor C12 is connected to the node Q. A node between the variable capacitors C11 and C12 is connected to the ground potential.

As described above, the first inductor L11 and the second inductor L12, the variable capacitor CV11 and the variable capacitor CV12, and the variable capacitor C11 and the variable capacitor C12 are connected in parallel each other.

The sources of the first NMOS transistor N11 and the second NMOS transistor N12 are connected to the ground potential, respectively, and the drains are connected to the node P. The output signal VP270 is inputted to the gate of the first NMOS transistor N11. The gate of the second NMOS transistor N12 is connected to the node Q.

The sources of the third NMOS transistor N13 and the fourth NMOS transistor N14 are connected to the ground potential, respectively, and the drains are connected to the node Q. The output signal VP180 is inputted to the gate of the NMOS transistor N14. The gate of the NMOS transistor N13 is connected to the node P.

In the embodiment of the present invention, the node P corresponds to a second output terminal and outputs a second output signal VP90. The node Q corresponds to a first output terminal and outputs a first output signal VP0.

The variable capacitor CV21 and the variable capacitor CV22 are connected between the node R and the node S in series. The variable capacitor CV21 is connected to the node R and the variable capacitor CV22 is connected to the node S. The frequency control voltage Vtu is applied to a node between the variable capacitor CV21 and CV22.

The variable capacitor C21 and the variable capacitor C22 are also connected between the node R and the node S in series. The variable capacitor C21 is connected to the node R and the variable capacitor C22 is connected to the node S. A node between the variable capacitors C21 and C22 is connected to the ground potential.

The sources of the fifth NMOS transistor N21 and the sixth NMOS transistor N22 are connected to the ground potential, respectively, and the drains are connected to the node R. The output signal VP0 is inputted to the gate of the NMOS transistor N21. The gate of the NMOS transistor N22 is connected to the node S.

The sources of the seventh NMOS transistor N23 and the eighth NMOS transistor N24 are connected to the ground potential, respectively, and the drains are connected to the node S. The output signal VP90 is inputted to the gate of the NMOS transistor N24. The gate of the NMOS transistor N23 is connected to the node R.

In the embodiment of the present invention, the node R corresponds to a fourth output terminal and outputs a fourth output signal VP270. The node S corresponds to a third output terminal and outputs a third output signal VP180.

The first optimization circuit 3 generates the current setting signal VI. The first optimization circuit 3 includes a peak voltage detection circuit 31, a first determination circuit 32, a current set value memory 33, a first switch SW1 and a second switch SW2.

The four-phase oscillation signals (output of the voltage controlled oscillator 2) are inputted to the peak voltage detection circuit 31 through the first switch SW1. The peak voltage detection circuit 31 detects each peak of the four-phase signals inputted. The peak voltage detection circuit 31 detects peak voltage values of the oscillation signals VP0, VP90, VP180 and VP 270 and outputs an averaged DC voltage.

The first determination circuit 32 outputs a control signal to correct the oscillation amplitude based on the DC voltage which is outputted by the peak voltage detection circuit 31. The current set value memory 33 outputs the current setting signal VI which sets a current to the current source Ip which is inside of the variable current generator 1 based on the control signal output from the first determination circuit 32. The current set value memory 33 stores the current setting signal VI. The second switch SW2 is connected between the first determination circuit 32 and the current set value memory 33.

The second optimization circuit 4 generates a signal for correcting the quadrature error. The signal for correcting the quadrature error corresponds to a capacitance set signal for setting a capacitance value of the variable capacitors C11, C12, C21 and C22 which are inside of the voltage controlled oscillator 2. The second optimization circuit 4 includes a 90-degree phase detector 41, a second determination circuit 42, a capacitance set value memory 43, a third switch SW3 and a fourth switch SW4.

The 90-degree phase detector 41 detects a quadrature error for an orthogonal differential pair signal. The differential pair signal is inputted through the third switch SW3. Note that, the differential pair signal is described in detail later.

The second determination circuit 42 outputs a signal which corrects the quadrature error based on the quadrature error which is detected by the 90-degree phase detector 41. The capacitance set value memory 43 supplies the capacitance set signal to the variable capacitors C11, C12, C21 and C22 in order to suppress the quadrature error based on the signal outputted by the second determination circuit 42. Further the capacitance set value memory 43 stores the capacitance set signal. The fourth switch SW4 is connected between the second determination circuit 42 and the capacitance set value memory 43.

The voltage controlled oscillator circuit 100 of the embodiment has above-mentioned constitution. Here the voltage controlled oscillator circuit 100 of the embodiment denotes a voltage controlled oscillator circuit which outputs four-phase signals. In the voltage controlled oscillator circuit for outputting four-phase signals as in the embodiment, when an amplitude is increased more than necessary by fluctuation, the voltage over an element withstand voltage is possibly supplied to the transistors (N11-N14, N21-N24) as well as a phase noise. Now, according to the voltage controlled oscillator circuit for outputting four-phase signals, the case where a voltage over the element withstand voltage is supplied to the transistors will be described with reference to FIGS. 2 and 3.

Figure 2:
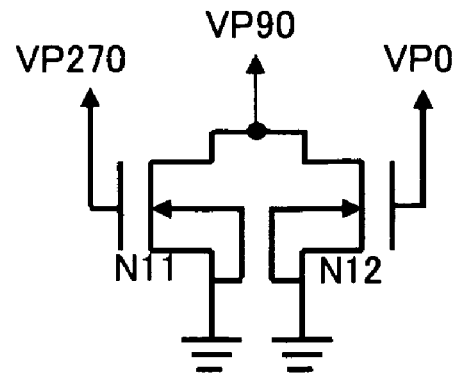
FIG. 2 is a diagram showing a voltage applied to an amplifier element.
Figure 3:
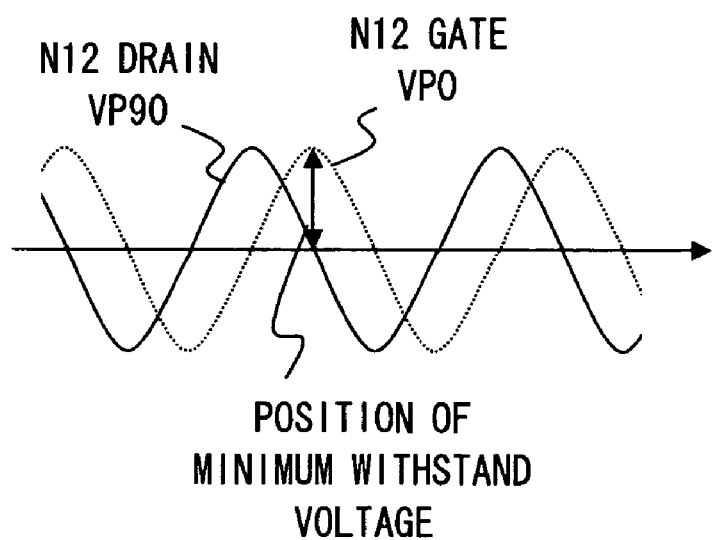
FIG. 3 is a diagram showing a gate voltage and a drain voltage of N12.

FIG. 2 shows a voltage applied to each terminal of the transistors by way of examples of the NMOS transistors N11 and N12 of the amplifier which is connected to the node P outputting VP90. According to the transistor in case of four-phase outputs, the voltages VP180 and VP0 are inputted to the gates of transistors N11 and N12 of the amplifier. The voltages VP180 and VP0 have phase difference of 90-degrees with respect to the output voltage VP90 of the node P. FIG. 3 is a waveform diagram showing the drain voltage VP90 and the gate voltage VP0 of the NMOS transistor N12. As shown in FIG. 3, since the voltages which have difference voltage of 90-degrees are applied to the drain and the gate, there is a case that the voltage applied to the drain is low and the voltage applied to the gate is high. When the voltage like this is applied, the withstand voltage of the transistors are reduced. In the voltage controlled oscillator circuit for outputting the four-phase signals, the element withstand voltage needs to be considered when the amplitude is increased more than necessary by fluctuation.

Therefore, according to the voltage controlled oscillator circuit 100 which is configured as in the embodiment, before outputting of a predetermined frequency signal by controlling voltages with normal operation, the first optimization circuit 3 and the second optimization circuit 4 perform an optimize operation in consideration of the withstand voltage, the phase noise and the quadrature error. Now, the optimize operation of the voltage controlled oscillator circuit 100 will be described.

At first, a first optimize operation is performed by the first optimization circuit 3 in order to determine current amount flowing in the voltage controlled oscillator 2. The first optimize operation (optimization) is performed from a perspective as follows.
1. The optimize operation prevents a voltage more than withstand voltage from being applied to the gate of the transistors which constitutes the amplifier by increasing a current.
2. The optimize operation prevents the property of the phase noise from degrading by a secondary distortion occurred in output waveform by excessive current.

According to the first optimization, the determination is made of whether a peak voltage is more than a voltage which is determined as the withstand voltage from the first perspective and whether the amplitude is increased when the current is increased from the second perspective. In addition, in a following description, the frequency control voltage Vtu which corresponds to the oscillation frequency is predetermined, and is inputted to the voltage controlled oscillator 2. In the voltage controlled oscillator circuit 100, inductor and capacitor of the voltage controlled oscillator 2 perform the oscillation operation based on the frequency control voltage Vtu and output four-phase output signals VP0, VP90, VP180 and VP270. Here in initial setting condition before the first optimization, the first optimization circuit 3 outputs a current setting signal VI corresponding to a minimum current, for example. Therefore the variable current generator 1 generates a minimum current among currents which the circuit 1 can output. It is assumed in the embodiment that a peak voltage of the output signal in initial condition is V0.

Figure 4:
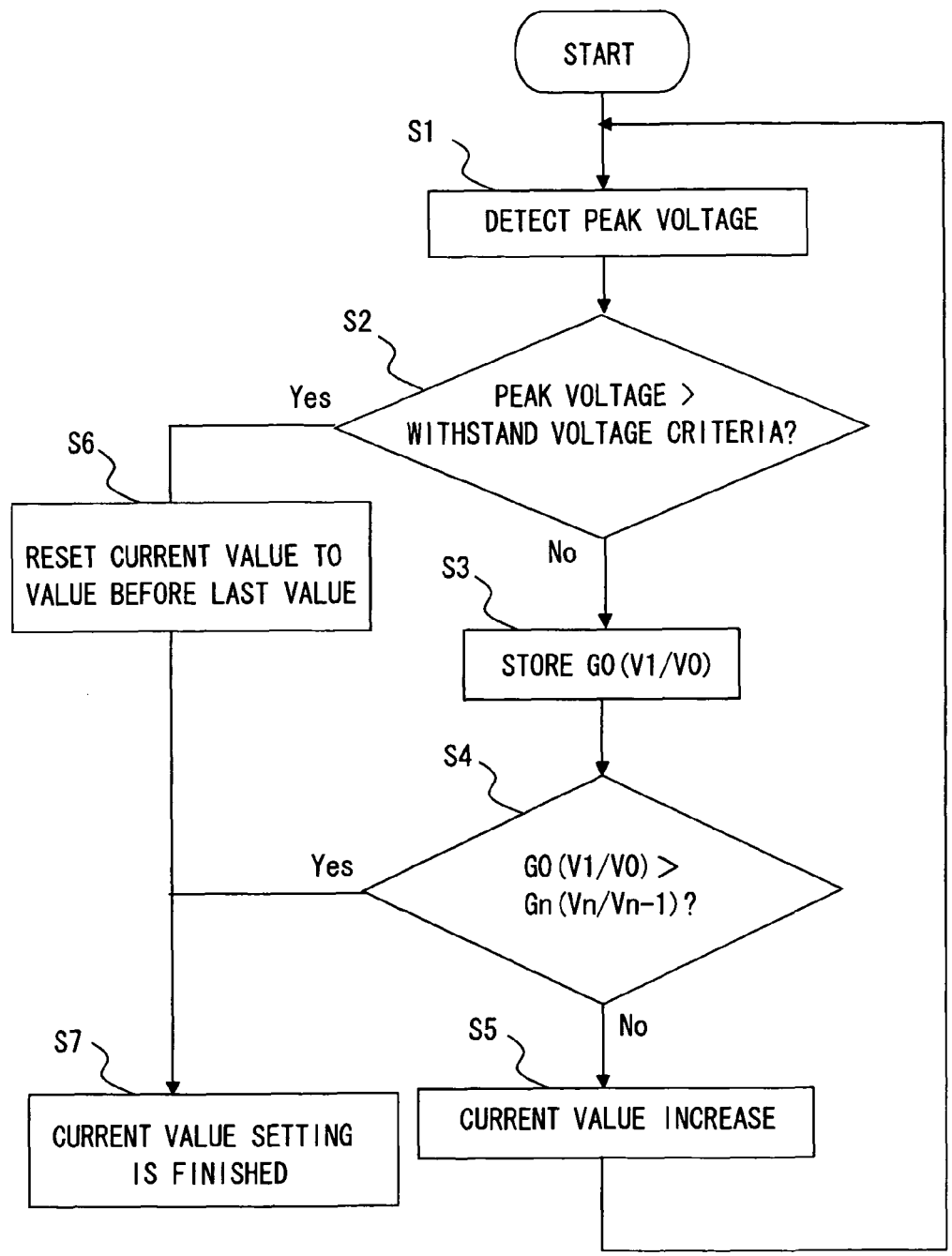
FIG. 4 is a flow chart showing an operation of a first optimization circuit.

FIG. 4 is a flow chart showing an operation which the first optimization circuit performs. The first optimization circuit will be described with reference to FIG. 4 as follows.

Step 1 (See FIG. 4, Step S1)

The output signals VP0, VP90, VP180 and VP270 are inputted to the peak voltage detection circuit 31 through the first switch SW1. The peak voltage detection circuit 31 outputs a peak voltage signal corresponding to a peak voltage which is detected.

Step 2 (See FIG. 4, Step S2)

The first determination circuit 32 compares a voltage value indicated by the peak voltage signal with a withstand voltage criteria. The first determination circuit 32 goes to next step if the peak voltage value is less than or equal to the criterion value. If the peak voltage value is more than the criterion value, the first determination circuit 32 outputs a signal which resets set current value to the set value before the last set value and finishes setting the current value.

Step 3 (See FIG. 4, Step S3)

In an initial state, as the peak voltage value is set to a minimum current, at least one current increase is performed in step S5 described later. In the step S3, a ratio of the peak voltage value V0 to the peak voltage value V1 after one current increasing is calculated. If the increase in one current is set to the predetermined value, the increase in the peak voltage value corresponding to the initial current increasing can be used as the criterion. Therefore the first determination circuit 32 stores the ratio of V0 to V1 as the criterion G0 of the determination in following step S4.

Step 4 (See FIG. 4, Step S5)

In step S4, a ratio of a peak voltage value Vn−1 after a previous current increasing (a peak voltage value after a current increasing of n−1 loops) to a latest peak voltage value Vn (a peak voltage value after a current increasing of n loops) is calculated. The Gn, calculated in this step, is compared with criterion G0 stored in step S3. Here if the criterion is G0>Gn, current setting is finished, and if the criterion is G0≦Gn, the operation goes to step S5.

Step 5 (See FIG. 4, Step S5)

The first determination circuit 32 outputs a signal for increasing a predetermined amount of a current to the current set value memory 33. It is only necessary for the signal which increases the predetermined amount of the current to increase a current amount corresponding to predetermined one step. The current set value memory 33 stores a new current set value and outputs a corresponding current setting signal VI and the operation goes back to step S1.

The first optimization circuit 3 of the preset invention repeats steps S1-S5 by the first determination circuit 32 and keeps updating the current set value stored by the current set value memory 33. Then, when a current value is finally set, the first optimization circuit 3 opens the second switch SW2 and determines an amount of a current which flows in the voltage controlled oscillator 2.

As mention above, the first optimization circuit 3 prevents a voltage which is equal to or more than the element withstand voltage from being applied to the transistor of the amplifier without further increasing the current which is flowed in the voltage controlled oscillator 2, when the peak voltage which is outputted by the voltage controlled oscillator 2 is above the element withstand voltage of the transistor of the amplifier.

Figure 5:
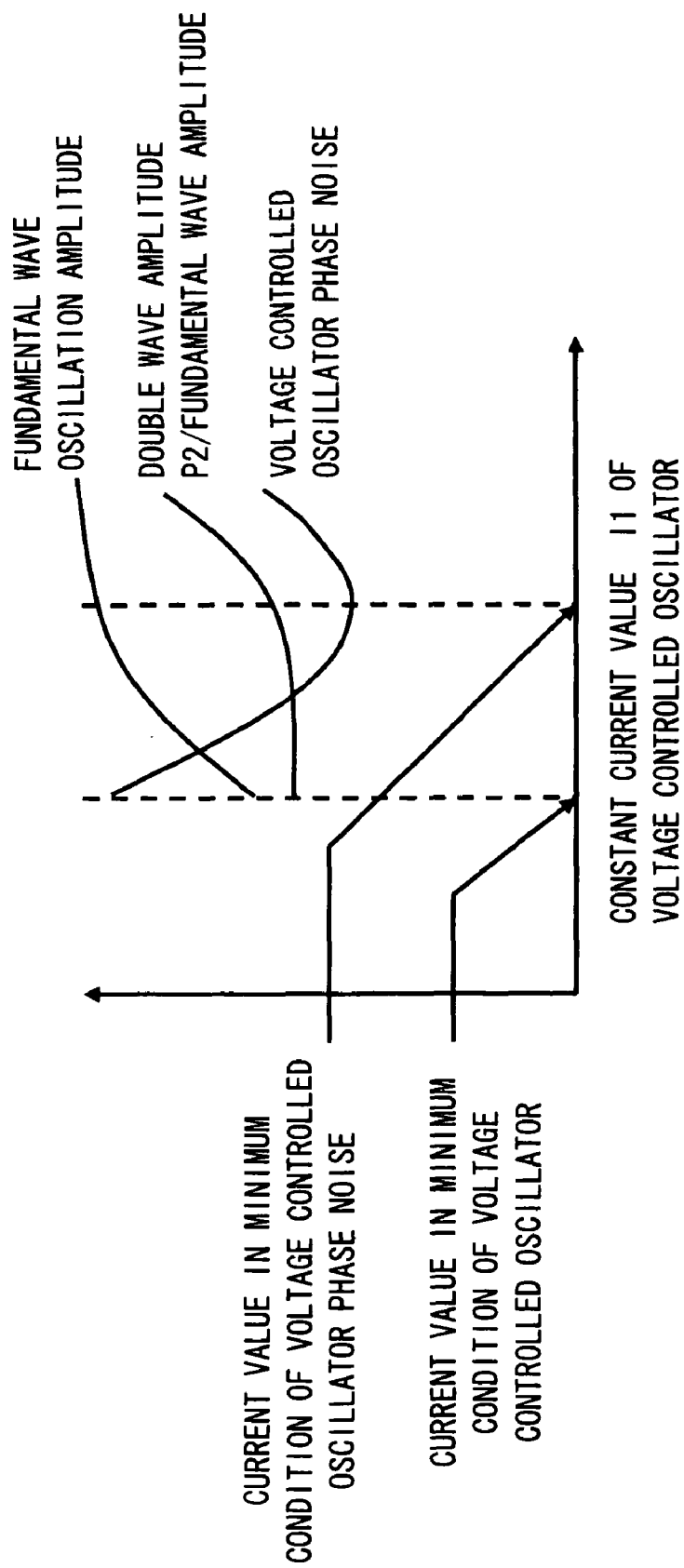
FIG. 5 is diagram showing a characteristic of the first embodiment of the present invention.

Further, in steps S3 and S4, the first optimization circuit 3 stores how much peak voltage is changed at the time of the current increasing of the initial stage as the criterion changes, and confirms the increase of the same ratio as the criterion for every current increasing. That is, the first optimization circuit 3 measures the change of amplitude of the output voltage corresponding to a certain current change amount. Here, when the peak voltage is not risen in same ratio although the current increasing amount is same as the current increased at first operation, it means that the amplitude is saturated and if a current amount is increased further, a current surge is flowed. Namely, if it is determined in step S4 that it is G0>Gn only a phase noise is increased by second distortion or third distortion even if the current is increased further. Therefore, in the first optimization circuit 3 of the embodiment, even if it is G0>Gn, the current increasing is stopped and setting current is finished (see FIG. 5).

As described above, as the current which is flowed in the voltage controlled oscillator 2 is set by the first optimization circuit 3, the variable current generator 1 can suppress the phase noise. Further if the variable current generator 1 can output four-phase signals, the variable current generator 1 can set the current value in consideration of the withstand voltage of the transistor of the amplifier.

After the optimization operation by the first optimization circuit 3, the second optimization circuit 4 performs a second optimization. Hereinafter the second optimization of the second optimization circuit 4 will be described.

Figure 6:
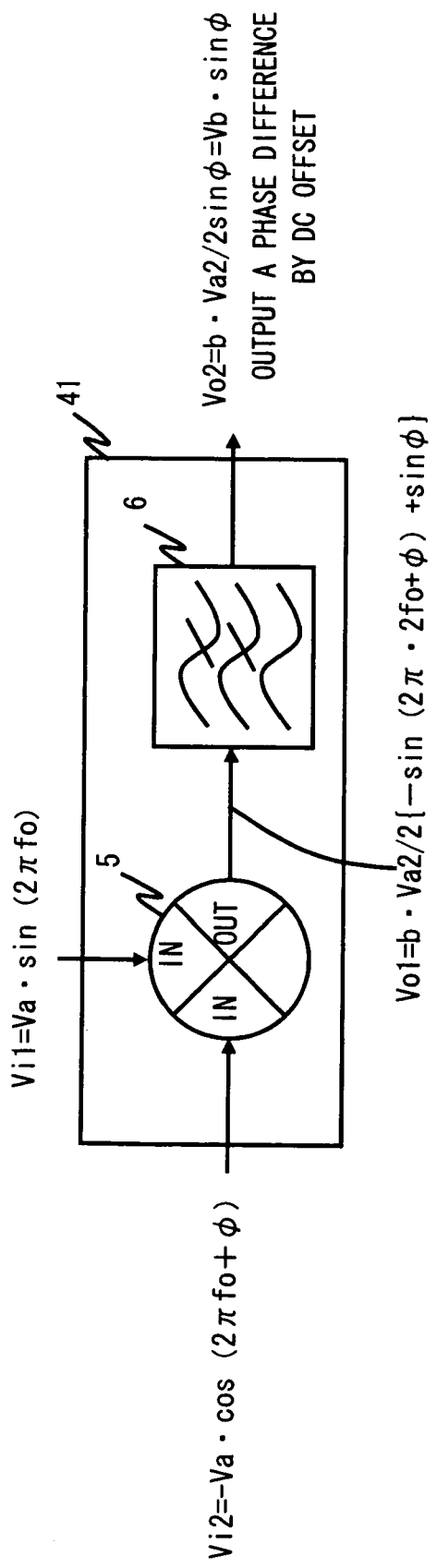
FIG. 6 is a diagram showing a 90-degree phase detector of the second optimization circuit.
Figure 7:
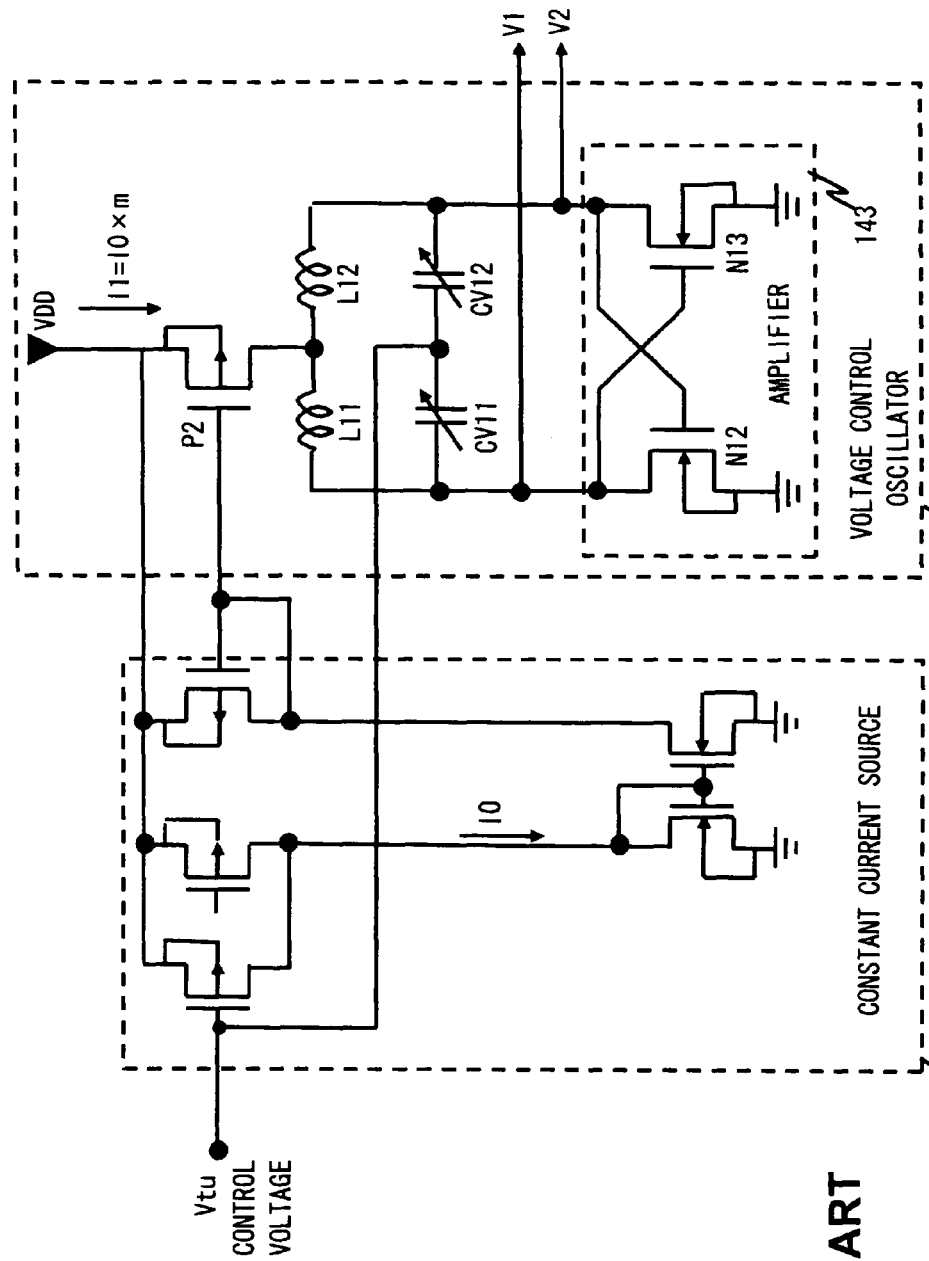
FIG. 7 is a circuit diagram showing a voltage controlled oscillator circuit of a related art.

The four-phase signals VP0, VP90, VP180 and VP270 which are outputted by the voltage controlled oscillator 2 are inputted to the 90-degree phase detector 41 through the third switch SW3. FIG. 6 is a diagram showing an internal constitution of the 90-degree phase detector 41.

The 90-degree phase detector 41 includes a mixer circuit 5 and law pass filter (LPF) 6. The mixer circuit 5 performs multiplication of a VP0-VP180 differential pair signal Vi1 and a VP90-VP270 differential pair signal Vi2 which is perpendicular to the VP0-VP180 differential pair signal Vi1. LPF 6 is a filter for passing a signal of which frequency is less than or equal to a specific frequency from among the signals outputted from the mixer circuit 5.

The VP0-VP180 differential pair signal Vi1 and the VP90-Vp270 differential pair signal Vi2 are perpendicular to each other. Therefore, if one signal is represented as a sine wave, the other signal is represented as a cosine wave. Here, if an oscillation amplitude is Va, an oscillation frequency is Fo, and a phase retardation of Vi1 and Vi2 is φ, the differential signals are represented as following.

$$VP0\text{-}VP180 \text{ differential pair signal: } Vi1 = Va \cdot \sin(2\pi fo)$$

$$VP90\text{-}VP270 \text{ differential pair signal: } Vi2 = -Va \cdot \cos(2\pi fo + \phi)$$

If the Vi1 and Vi2 are inputted to the mixer circuit 5, the mixer circuit 5 outputs a signal which is represented as a following expression.

$$Vo1 = (b \cdot Va^2/2)\{-\sin(2\pi \cdot 2fo + \phi) + \sin \phi\}$$

In the above expression, first term represents a double wave component, and second term represents a DC component which is generated from the phase error. Therefore the DC component is a value reflecting the phase error φ.

The signal Vo1 outputted from the mixer circuit 5 is inputted to LPF 6. The first term is attenuated by LPF 6, and LPF 6 outputs a signal which has an expression corresponding to the DC component of the second term.

$$Vo2 = (b \cdot Va^2/2)\sin \phi = Vb \cdot \sin \phi.$$

In the second optimization circuit 4, an output of the 90-degree phase detector 41 is inputted to the second determination circuit 42 as a phase detection signal Vo2=Vb·sin φ. The phase detection signal Vo2 is proportional to sin φ of the phase error φ corresponding to above VP0-VP180 differential pair signal Vi1 and an orthogonal (90-degree) signal of the VP90-Vp270 differential pair signal Vi2. Therefore the phase detection signal Vo2 can be set to a criterion which detects an orthogonal error.

The second determination circuit 42 to which the Vo2=Vb·sin φ is inputted performs the following control operation. First, in a case that the phase detection signal Vo2 outputted from the 90-degree phase detector 41 is plus with respect to a predetermined criterion, it is determined that VP90-VP270 has phase retardation. In this case, an order to advance a VP90-VP270 differential pair phase is inputted to the capacitance set value memory 43. The capacitance set value memory 43 outputs capacitance set signals VCA and VCB which make the capacitances of C11 and C21 smaller than C 12 and C22.

On the other hand, in a case that the phase detection signal Vo2 outputted from the 90-degree phase detector 41 is minus with respect to a predetermined criterion, it is determined that phase of VP90-VP270 is advanced. In this case, an order to delay a VP90-VP270 differential pair phase is inputted to the capacitance set value memory 43. The capacitance set value memory 43 outputs capacitance set signals VCA and VCB which make the capacitances of C11 and C21 larger than those of C12 and C22.

The second optimization circuit 4 converges when a determination result of the second determination circuit 42 is less than a criterion or the determination result becomes minimum with respect to the criterion after repeating predetermined cycles of determination. The condition is stored in the capacitance set value memory 43 and the capacitance set value memory 43 keeps the capacitance set signals VCA and VCB. Then the third switch SW3 and the fourth switch SW4 are turned off.

As above described, by setting the second optimization circuit 4, the variable current generator 1 detects 90-degree orthogonal error and corrects the 90-degree orthogonal error based on the detecting result. After generating a desired capacitance set signal, the third switch SW3 and fourth switch SW4 are turned off and the capacitance set signal is stored in the capacitance set value memory 43. Therefore, wasted power consumption is restrained and the variable current generator 1 can prevent the noise generated by the feedback circuit from being added.

As described in detail, the voltage controlled oscillator circuit 100 of the embodiment includes the first optimization circuit and the second optimization circuit. The current value flowed in the voltage controlled oscillator 2 is optimized by the first optimization circuit. Thus even if there is a variability of an element, the voltage controlled oscillator circuit 100 prevents the current form being amplified excessively in the amplifier of the voltage controlled oscillator 2 and prevents phase noise characteristic from deteriorating. Further, if the voltage controlled oscillator circuit 100 outputs four-phase signals, the optimal current is set in the voltage controlled oscillator 2 in consideration of the withstand voltage.

Furthermore, the second optimization circuit 4 controls the capacitances of the variable capacitors C11, C12, C21 and C22 based on the phase error of the orthogonal component. Therefore the four-phase outputs which minimize the phase error as well as the phase noise can be obtained. Further the switches SW1-SW4 are turned off after finishing optimization of the first optimization circuit 3 and the second optimization circuit 4. Therefore, wasted power consumption is restrained in the normal operation, and the voltage controlled oscillator circuit 100 that can reduce the phase noise and phase error can be provided.

Note that the present invention is not limited to the above-described embodiment. Needless to say, various changes can be made without departing from the spirit of the present invention. For example, we explained that the peak voltage detection circuit outputs the average value of the four-phase outputs. However the peak voltage detection circuit can also detect and output a highest voltage. In this case, as the current flowed in the voltage controlled oscillator 2 is determined based on the highest voltage, voltage less than the withstand voltage can be applied to each element of the amplifier without fail. Further, if the current value is decided based on the change of the ratio of the peak voltage, the optimum current value can be decided for the voltage controlled oscillator circuit 100 which does not output the four-phase signals.

It is apparent that the present invention is not limited to the above embodiment, but may be modified and changed without departing from the scope and spirit of the invention.

What is claimed is:

1. A voltage controlled oscillator circuit comprising:
    a variable current generator supplying an operation current based on a current setting signal;
    a voltage controlled oscillator comprising a resonance circuit including a variable capacitor and an inductor, and outputting an output signal having an amplitude based on a current generated by the variable current generator; and
    a first optimization circuit receiving the output signal, and generating and outputting the current setting signal to the variable current generator based on an amplitude change of the output signal corresponding to a change of the current generated by the variable current generator,
    wherein the first optimization circuit stores the amplitude change based on a first current set value change as a criterion, and when an amplitude change of the output signal corresponding to the change of current flowed by the variable current generator based on a second current set value change does not meet the criterion, an optimize operation is finished.

2. The voltage controlled oscillator circuit according to claim 1, wherein the first optimization circuit compares a peak voltage of the output signal of the voltage controlled oscillator with a predetermined criteria withstand voltage, and generates the current setting signal based on a comparison result.

3. The voltage controlled oscillator circuit according to claim 1, wherein the voltage controlled oscillator outputs multiple-phase signals.

4. The voltage controlled oscillator circuit according to claim 3, wherein the voltage controlled oscillator includes a second optimization circuit to correct a phase error between multiple-phase outputs.

5. The voltage controlled oscillator circuit according to claim 4, wherein the second optimization circuit comprises:
    a phase detection circuit to detect the phase error between the multiple-phase outputs; and
    a determination circuit to output a signal for correcting a phase error based on the phase error between multiple-phase outputs.

6. The voltage controlled oscillator circuit according to claim 5, wherein the signal for correcting the phase error sets a capacitance of the variable capacitor.

7. The voltage controlled oscillator circuit according to claim 1, wherein the first optimization circuit outputs the current setting signal according to the amplitude change of the output signal over a predetermined period of time and a reference value for an amplitude change of the output signal.

8. The voltage controlled oscillator circuit according to claim 1, wherein the first optimization circuit outputs the current setting signal according to a comparison of a first amplitude change of the output signal as a criterion value with a second amplitude change of the output signal, the first amplitude change being determined before the second amplitude change by the first optimization circuit.

9. The voltage controlled oscillator circuit according to claim 1, wherein the first optimization circuit compares the amplitude change of the output signal corresponding to the change of current flowed by the variable current generator based on the first current set value change with the criterion, the criterion being set according to a previously determined amplitude change based on a second current set value change.

10. An oscillator circuit comprising:
    a power source supplying an electrical power signal variable according to a setting signal;
    an oscillator controlling an oscillation frequency by an input from the power source and outputting an output signal having an amplitude based on the electrical power signal outputted by the power source; and
    a first optimization circuit receiving the output signal from the oscillator, and outputting the setting signal to the power source based on an amplitude change of the output signal from the oscillator, the amplitude change of the output signal corresponding to a change of the electrical power signal over time outputted by the power source,
    wherein the first optimization circuit stores the amplitude change based on a first change in value of the setting signal as a criterion and, when an amplitude change of the output signal corresponding to the change of the electric power signal from the power source based on a second change in value over time for the setting signal does not meet the criterion, an optimize operation of adjusting the setting signal finishes.

11. The oscillator circuit according to claim 10, wherein the first optimization circuit compares a peak voltage of the output signal of the oscillator with a predetermined criteria withstand voltage, and generates the setting signal based on a comparison result.

12. The oscillator circuit according to claim 10, wherein the oscillator outputs multiple-phase signals.

13. The oscillator circuit according to claim 10, further comprising a second optimization circuit to correct phase errors between multiple-phase outputs from the oscillator.

14. The oscillator circuit according to claim 13, wherein the second optimization circuit comprises:

a phase detection circuit to detect the phase error between the multiple-phase outputs; and a determination circuit to output a signal for correcting a phase error based on the phase error between multiple-phase outputs.

15. The oscillator circuit according to claim 14, wherein the signal for correcting the phase error sets a capacitance of a variable capacitor in the oscillator.

16. A method for a voltage controlled oscillator circuit, the method comprising:

supplying an operation current based on a current setting signal by a variable current generator;

outputting, by a voltage controlled oscillator, an output signal having an amplitude based on a current received from the variable current generator, the voltage controlled oscillator comprising a resonance circuit including a variable capacitor and an inductor;

receiving the output signal from the voltage controlled oscillator by a first optimization circuit; and outputting, by a first optimization circuit, the current setting signal to the variable current generator based on an amplitude change of the output signal, the amplitude change of the output signal corresponding to a change of the current outputted by the variable current generator, wherein the first optimization circuit stores the amplitude change based on a first current set value change as a criterion and, when an amplitude change of the output signal corresponding to the change of current flowed by the variable current generator based on a second current set value change does not meet the criterion, an optimize operation is finished.

17. The method according to claim 16, further comprising correcting a phase error, by a second optimization circuit, between multiple-phase outputs from the voltage controlled oscillator.

18. A voltage controlled oscillator circuit comprising:

a voltage controlled oscillator which includes a resonance circuit including an inductor and a variable capacitor, and varies an amplitude of an output signal according to an operation current;

a variable current generator which varies the operation current according to a current setting signal; and a first optimization circuit which fluctuates a value indicated by the current setting signal based on an amplitude change of the output signal, wherein the first optimization circuit stores an amplitude change rate of the output signal before and after updating of a value of the current setting signal as a criterion, calculates the amplitude change rate of the output signal before and after updating every time the value of the current setting signal is updated, and terminates an optimization operation when the calculated amplitude change rate is less than the criterion.

* * * * *